United States Patent
Matsuura et al.

[11] Patent Number: 5,973,766
[45] Date of Patent: *Oct. 26, 1999

[54] EXPOSURE METHOD AND EXPOSURE DEVICE

[75] Inventors: Toshio Matsuura, Tokyo; Nobutaka Fujimori; Toshinobu Morioka, both of Fujisawa; Kei Nara, Yokohama, all of Japan

[73] Assignee: Nikon Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/856,029

[22] Filed: May 14, 1997

[30] Foreign Application Priority Data

May 16, 1996 [JP] Japan .................................. 8-121940
May 17, 1996 [JP] Japan .................................. 8-123481

[51] Int. Cl.⁶ .............................. G03B 27/68; G03B 27/42
[52] U.S. Cl. .............................. 355/52; 355/53; 356/401; 430/22
[58] Field of Search .............................. 355/52, 53, 55; 356/399, 400, 401; 430/22

[56] References Cited

U.S. PATENT DOCUMENTS

| | | | |
|---|---|---|---|
| 4,780,617 | 10/1988 | Umatate | 356/401 |
| 4,833,621 | 5/1989 | Umatate | 356/401 |
| 5,117,255 | 5/1992 | Shiraishi et al. | 355/53 |
| 5,442,418 | 8/1995 | Murakami et al. | |

*Primary Examiner*—Alan A. Mathews
*Attorney, Agent, or Firm*—Chapman and Cutler

[57] ABSTRACT

An exposure device sequentially transfers a pattern formed in a mask onto connected multiple regions present consecutively on a substrate through a projection optical system. The device includes a substrate stage moving in two dimensions and carrying the substrate in a movement coordinate system determined by a first axis and a mutually perpendicular second axis. A mark detecting sensor detects positions of alignment marks formed on the substrate. A magnification adjustment device corrects the magnification of the projection optical system. At least one calculating device is used to separately calculate extension amounts of the substrate in the direction of the first axis and in the direction of the second axis based on information relating to the positions of the alignment marks detected by the mark detecting sensor. An amount of magnification correction provided by the magnification adjustment device is set based on the extension amounts calculated, and scales of the first and second axes of the movement coordinate system specifying movement of the substrate stage are changed by identical amounts.

30 Claims, 11 Drawing Sheets

EXPOSURE METHOD AND EXPOSURE DEVICE

BACKGROUND OF THE INVENTION

1. Field of the Invention

The present invention relates to a method of exposure and an exposure device for substrates used in manufacturing liquid-crystal display (LCD) elements and semiconductor elements. In particular, the invention concerns a method of exposure and an exposure device for forming a single device pattern by connecting multiple shots on a substrate.

2. Description of Related Art

One of the steps in manufacturing devices such as liquid-crystal displays and semiconductor elements is an exposure step in which the pattern of a reticle or mask (referred to hereinafter as a reticle) is exposed by projection onto a photosensitive substrate (referred to hereinafter simply as a substrate) such as a glass substrate or a wafer coated with resist. One method of projection exposure is known as the "step-and-repeat" method in which, after a pattern formed on a reticle has been exposed onto a specific region of a substrate, the substrate is stepped only a specific distance. The reticle pattern is then exposed again, and so on.

In exposure devices using the step-and-repeat method, to correctly position the reticle and the substrate, a reticle stage displacing the reticle within a plane perpendicular to the optical axis of the projection optical system, a substrate stage displacing the substrate within a plane perpendicular to the projection optical system, and a magnification controller controlling projection magnification of the projection optical system to project the pattern on the mask onto the substrate at a prescribed magnification are provided.

For large surface area LCDs, the LCD device pattern on the substrate is normally formed by a step-and-repeat type exposure device by picture synthesis. In picture synthesis, as shown in FIG. 7, for example, the pattern 10 of a single LCD device is divided into four patterns A, B, D, and D, and exposed. Each of patterns A, B, C, and D corresponds to a single reticle. Normally, the pattern of an LCD device including patterns A, B, C, and D is exposed onto the substrate (glass plate) using several devices at one time. FIG. 8 is an example of the formation of the device patterns 41–46 of six LCDs on a single substrate P. When manufacturing LCDs for TFTs (thin film transistors), 6–7 layers of overlay exposure are conducted during processing. This process may vary depending on device configuration. During pattern exposure, alignment marks ALM1, ALM2, . . . are also exposed. During exposure of the following layer, these alignment marks ALMn (n=1, 2, . . . ) are detected to determine subsequent shot positions.

Even when exposing a pattern such as that shown in FIG. 8 onto substrate P, due to subsequent processing, the substrate P sometimes expands nonlinearly in the manner shown by solid lines in FIG. 9, for example, and becomes deformed (FIG. 9, upper left). When the pattern of a subsequent layer, indicated by the dotted lines in FIG. 9, is overlaid and exposed onto a pattern 51–56 that has been nonlinearly deformed by processing subsequent to exposure, indicated by the solid lines in FIG. 9, a substantial overlay misalignment results in the deformed portion of the device pattern 51.

Methods of high-precision overlaying and exposure of subsequent layers of patterns on the pattern of a deformed substrate P include the enhanced global alignment (EGA) method. In this method, the regularity of a shot arrangement is specifically determined in a statistical manner. This is described, for example, in U.S. Pat. No. 4,780,617. However, in the EGA method, even though it is possible to correct for linear expansion and conduct overlay exposure, significant overlay misalignment occurs in nonlinearly deformed portions.

U.S. Pat. No. 4,833,621 is an example of a method in which the shot position is corrected for each shot, permitting good overlay exposure even when there is nonlinear deformation of the substrate. This method permits exposure while maintaining high overlay precision for each shot, and is useful when configuring one or more devices per shot, as in LSIs. However, this method is not effective for exposure methods in which a single device is configured by multiple shots, such as in picture synthesis in LCDs and the like.

FIG. 10 shows an example of overlay exposure by a method in which the shot position is corrected for each shot (A, B, C, D) as is set forth above. An LCD device pattern is formed by connecting the four patterns A, B, C, and D in a picture synthesis method. In FIG. 10, the device patterns denoted by solid lines represent previous layer patterns that have undergone nonlinear deformation. The patterns denoted by dotted lines represent exposure patterns overlaid thereon. Inspection of a device pattern 61 in the upper left portion of FIG. 10, in which nonlinear deformation has occurred, reveals that each of patterns A, B, C, and D has been overlaid with good precision onto the pattern of the preceding layer. However, picture connection errors at the borders of the synthesized patterns, such as at the border of pattern A and pattern B and the border of pattern A and pattern C, and vertical layer overlay precision errors at picture connections are substantial.

When the picture connection errors at the borders of the synthesized patterns and the overlay errors at picture connection areas are substantial, the performance of the elements formed on either side of the borderline varies greatly. As a result, lines due to variance in contrast at the borderline position appear in the finished LCD.

Further, when the substrate expands due to the effects of other processes, the magnification controller adjusts the magnification of the projection optical system. In conventional exposure devices, the combination precision between adjacent pattern regions is emphasized for each pattern of the first layer. The overlay precision relative to each pattern in the previous layer is emphasized for each pattern of the second layer and so on in the formation of LCD patterns through combination using the picture synthesis method.

In exposure of the second layer and so on, the positions of the alignment marks previously formed on the substrate during the exposure of each pattern are detected, the expansion rate in two dimensions of the substrate is calculated based on the detection results, and the projection magnification and scaling of the substrate stage are altered. The expansion rate ($\gamma X$) in the X-axis direction and the expansion rate ($\gamma Y$) in the Y-axis direction, which are the directions of movement of the substrate stage, are calculated, and the substrate scale of the substrate stage in the X-axis direction is changed by $\gamma X$ and in the Y-axis direction by $\gamma Y$. The average value, m, of $\gamma X$ and $\gamma Y$ ($m=(\gamma X+\gamma Y)/2$) is set as the magnification correction value. Based on the magnification correction value, the magnification controller controls the projection magnification of the projection optical system, thereby ensuring overlay precision.

FIG. 11 shows what happens when pattern exposure from the second pattern on has been conducted by using the prior art method described above. The shot region that was originally the region denoted by dotted line S has expanded into the region S', denoted by the solid line, after exposure of the second layer due to swelling of the substrate caused by processing. In exposure from the second layer on, when the scale in the X-axis direction of the substrate stage is separately changed by γX, the scale in the Y-axis direction of the substrate stage is separately changed by γY, and the projection magnification of the projection optical system is separately changed by (γX+γY)/2, patterns extending beyond the individual shot regions in the X-axis direction are transferred and patterns that are narrower than the individual shot regions only in the Y-axis direction are transferred. In the Lx portion, defining a strip extending in the Y-axis direction, adjacent patterns overlap. In the Ly portion, defining a strip extending in the X-axis direction, a gap is formed between adjacent patterns.

When the overlay precision of each pattern is emphasized in this manner, the connecting portions of the first layer, that is, the pattern overlay in the Lx and Ly strip portions, changes and the characteristics of the element formed by the patterns are altered at this border. Even when these changes in element characteristics are slight, sharp changes on either side of the connecting portion of the first layer cause the changes to appear quite prominently to the human eye as a border line on the liquid-crystal display.

SUMMARY OF THE INVENTION

One object of the present invention is to provide a picture synthesis-type pattern exposure method in which device performance does not deteriorate even when there is non-linear deformation caused by substrate expansion.

A further object of the present invention is to perform pattern exposure by optimizing the differential overlay while minimizing a loss in overlay precision.

In the present invention, the above-stated objects are achieved by treating, as a single unit, a single device formed by picture synthesis from multiple exposure shots, and integrally controlling parameters for correcting the shot positions of the overlay exposures. Examples of these parameters are shot position offset, rotation, and magnification. Correction of the shot position is preferably conducted so as to minimize the differential overlay precision at connecting portions of the multiple shots forming the device pattern.

Shot position correction parameters are not set and controlled for each shot. These parameters are instead set and controlled for units of multiple shots forming a single device. This permits suppression of both picture connection errors during picture synthesis and the differential overlay precision of connected portions to low levels. Uniformity throughout the device of the performance of elements formed in the device is also ensured. Thus, problems such as the appearance of undesirable lines in the LCD picture can be prevented.

Further, in the present invention, an exposure device, sequentially transferring a pattern formed in a mask onto connecting multiple regions present consecutively on a substrate through a projection optical system, includes a substrate stage moving in two dimensions and carrying the substrate along a movement coordinate system determined by a first axis and a mutually perpendicular second axis. The positions of alignment marks formed on the substrate are detected and the magnification of the projection optical system is corrected. The amounts of extension of the substrate in the direction of the first axis and the direction of the second axis are separately calculated based on information relating to the position of the alignment marks detected. The amount of magnification correction is set based on the amount of extension calculated. The scales of the first and second axes of the movement coordinate system specifying movement of the substrate stage are changed by identical amounts.

Here, changing the scales of the first and second axes of the movement coordinate system is equivalent to, for example, changing the amount the stage moves during stepping from the region of the first shot to the region of the second shot on the substrate.

The first layer pattern is exposed by mask correction (mask shifting, mask rotation) and magnification correction of the projection optical system to conform to the stage coordinate system. Next, scaling in the X-axis direction and Y-axis direction of the substrate that has been exposed to the first layer and has expanded due to processing is measured. During exposure of the second layer pattern, exposure is conducted by mask correction (mask shifting, mask rotation) to conform to the same stage coordinate system as that utilized for the first layer, assuming that there has been no expansion of the exposed substrate. If it is found that there has been expansion of the substrate when preparing to expose the second layer pattern, then the magnification of the projection optical system is corrected by precisely the amount of magnification correction required by the amount of expansion. The amount of stepping in the X-axis and Y-axis directions is corrected by the same amount as in magnification correction.

Based on the present invention, in the pattern formation of each layer, exposure is conducted by considering extension of the substrate and exposing a pattern arrangement that has been isotopically expanded or contracted by a precise amount of projection magnification correction. In each layer, the connecting portions of the connecting patterns connect completely. As a result, there is, in principle, no differential overlay. Furthermore, the overlay precision can be adapted to within the extension differential in the X-axis and Y-axis directions.

DESCRIPTION OF THE PREFERRED EMBODIMENTS

The present invention will be described in detail using, as an example, an overlay exposure of an LCD pattern onto a resist-coated substrate (glass plate).

Figure 1:
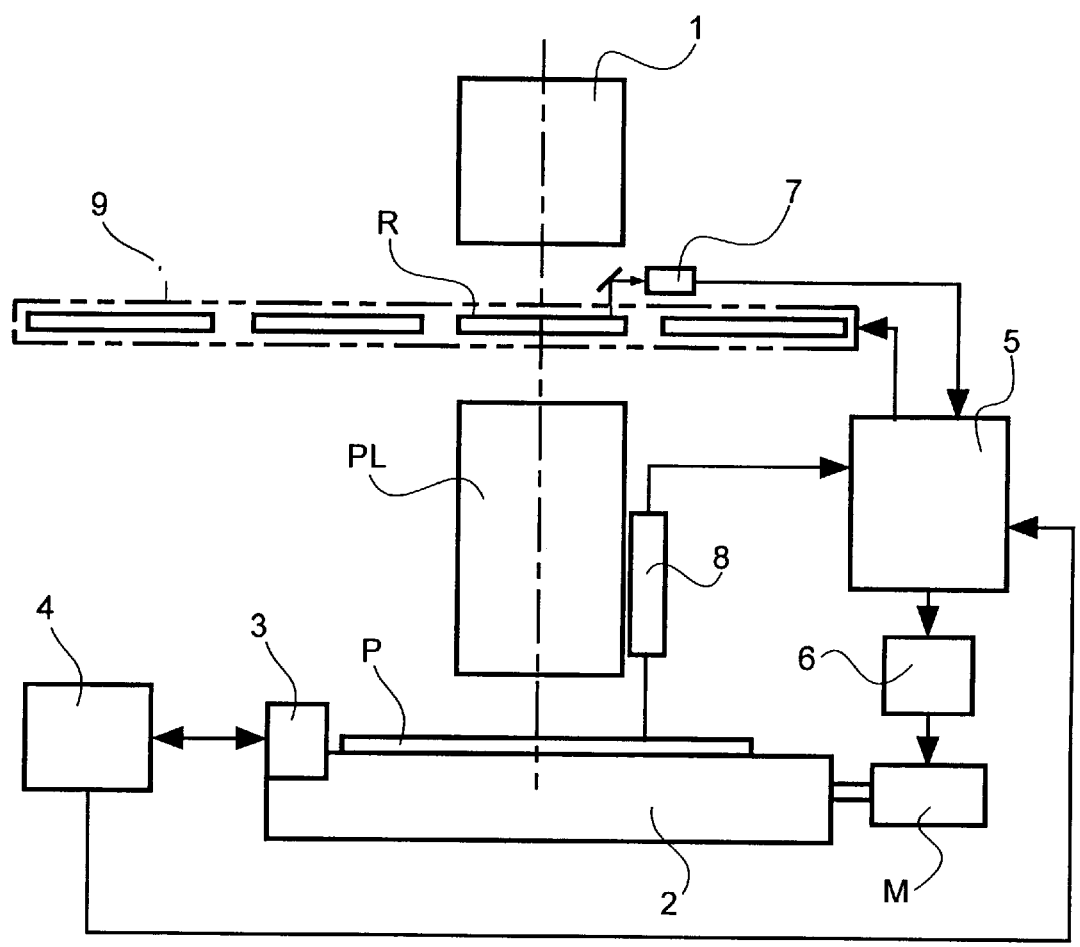
FIG. 1 is a schematic illustration of an exposure device showing a first embodiment of the present invention.

FIG. 1 shows a step-and-repeat type exposure device employed for the pattern exposure of LCDs according to a first embodiment of the present invention. The pattern of a reticle R illuminated by an illuminating optical system 1 is transferred to a prescribed region on a substrate P mounted on an XY stage 2 by a projection optical system PL. A mobile mirror 3 is fixed on the XY stage 2. The two-dimensional position coordinates of the XY stage 2 are monitored by measuring the distance of the mobile mirror 3 with a laser interferometer 4. A main controller 5 servocontrols the XY stage 2 by driving a motor M, through a stage controller 6, based on information about the current position of the XY stage 2 outputted by the laser interferometer 4 and coordinate position information (a shot address value). The alignment system for aligning positions is provided with a reticle alignment system 7 aligning the reticle R and a substrate alignment system 8 for aligning the substrate P. A reticle switching mechanism 9 is also provided for switching the reticle 9.

Figure 7:
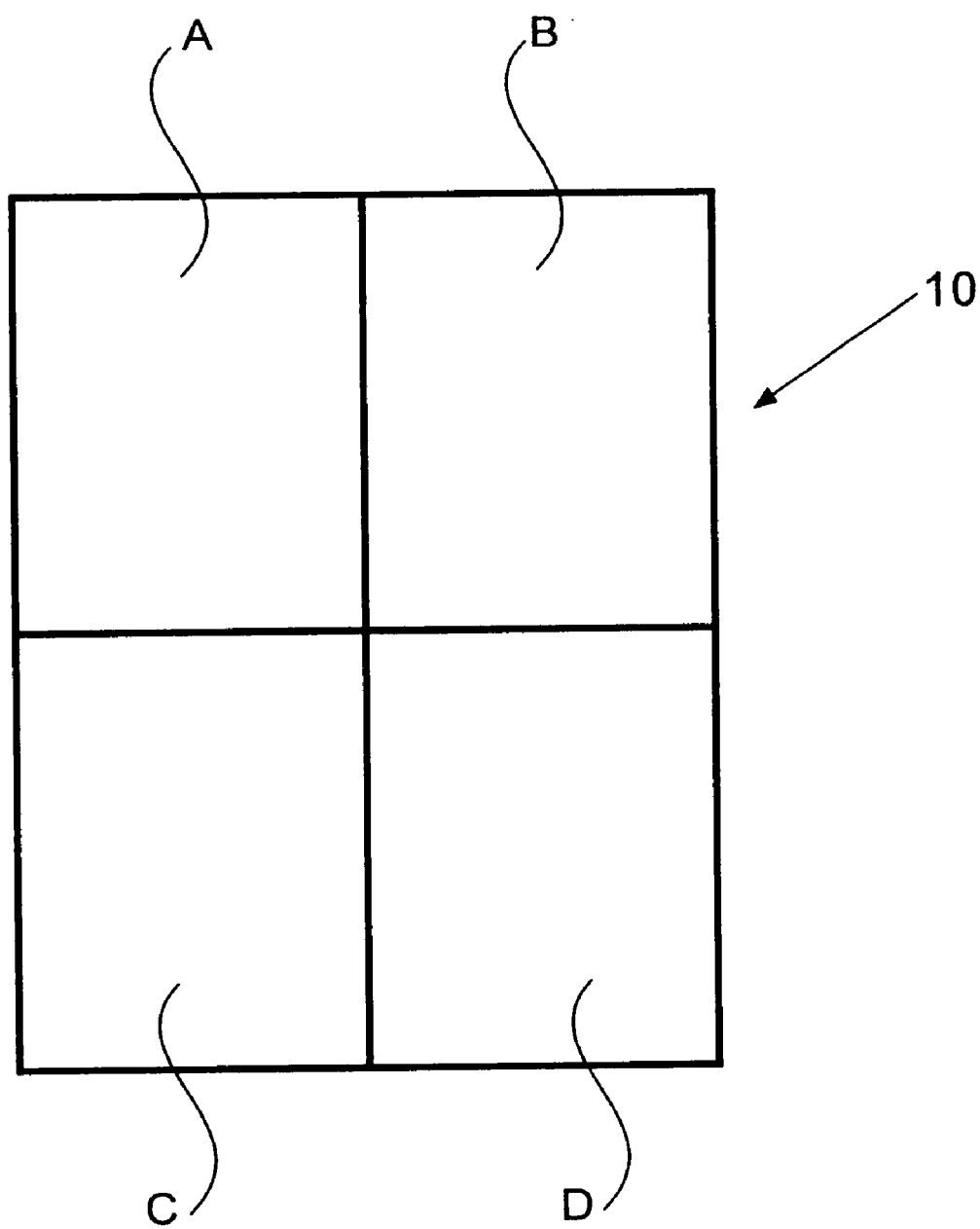
FIG. 7, as noted above, shows a known manner of connecting exposures.
Figure 8:
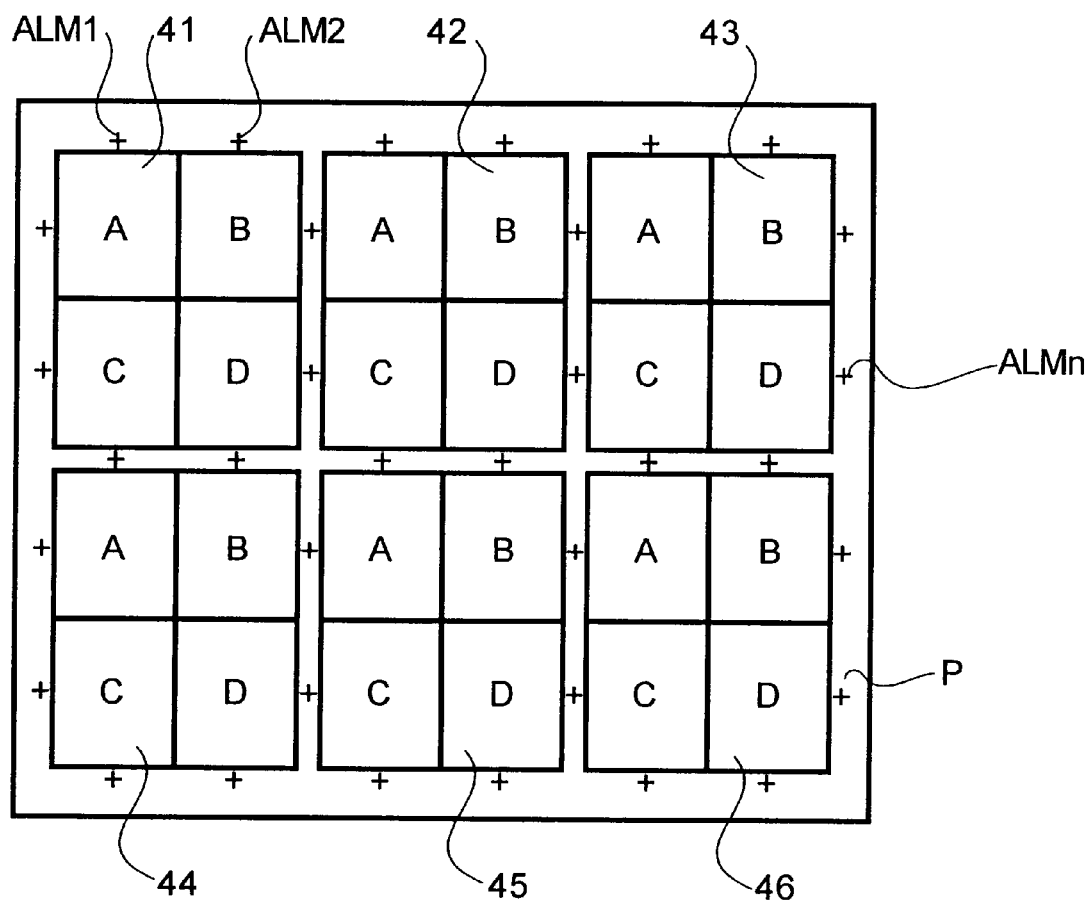
FIG. 8, as noted above, shows a known pattern layout.

An LCD pattern is formed on the substrate P by, for example, dividing a single device pattern into the four patterns A, B, C, and D as shown in FIG. 7. The four patterns are connected by a picture synthesis method. Each of the patterns A, B, C, and D corresponds to a single reticle R. While switching the four reticles R with the reticle switching mechanism 9, the XY stage 2 is moved in steps to position patterns A, B, C, and D on the substrate P in adjacent areas for exposure. Multiple (six in this example) device patterns are formed on the substrate. Alignment marks ALMn (n=1, 2, 3, . . . ) are exposed around the device patterns at the same time the patterns are exposed.

Figure 2:
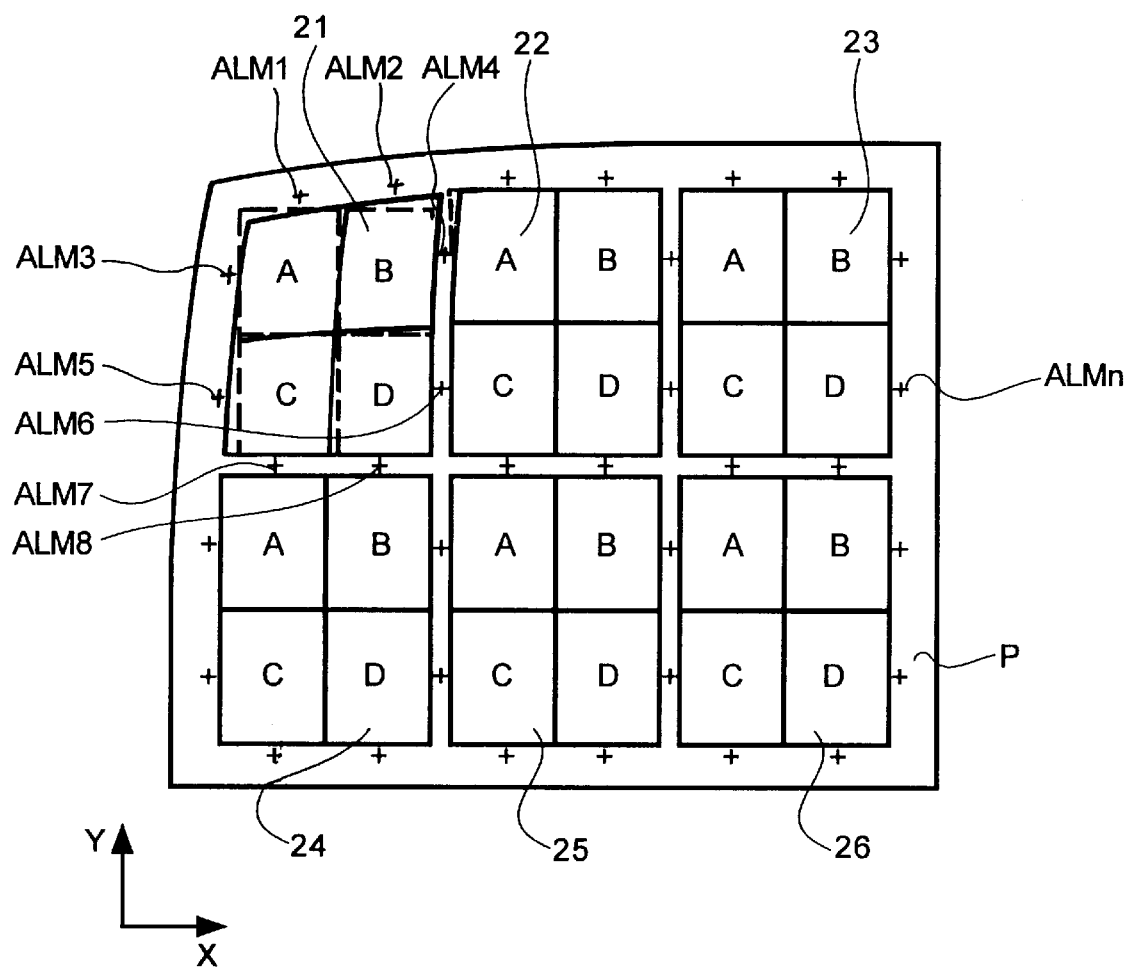
FIG. 2 is a representation of the exposure method of the present invention.

When nonlinear expansion such as that indicated by the solid line in FIG. 2 has occurred, there is distortion of the upper left portion once the substrate P, on which the six device patterns have been exposed, has been processed. The deformation of substrate P causes the arrangement coordinates of the individual alignment marks ALMn (n=1, 2, 3 . . . ) to become skewed as patterns A, B, C, and D are deformed. The arrangement coordinates of the alignment marks can be measured from the output of the laser interferometer 4 when the XY stage 2 is moved and the alignment marks ALMn are detected by the substrate alignment system sensor 8.

Measurement of the deformation of the substrate thus deformed and the method of correcting the shot positions of the following layer will now be described. Shot position correction parameters, such as shot offset, rotation, and projection magnification, are derived for a single device unit including the picture synthesis of multiple shots. That is, correction parameters are calculated for each of the devices 21, 22, 23 . . . 26. The correction parameters are calculated so as to minimize the picture connection error of shots A, B, C, and D, the differential overlay precision at connecting portions, and overlay errors in each device. A common statistical method is employed for the calculations, and the values are rounded off by least-square approximation. The calculations are sometimes performed so as to minimize the maximum error. Since values with different correction parameters for the differential overlay precision of connected portions and the overlay precision of the device as a whole are sometimes obtained, it is possible to designate one or the other as having priority, or to weight the two and calculate the correction parameters. When the differential overlay precision of the connecting portions is given priority in picture synthesis, differences in the TFT performance of the LCD connecting portions disappear, yielding a high-performance LCD.

An example of the calculation of shot position correction parameters by least-square approximation will be given. The device being examined is designated by the number 21. The arrangement coordinates for the design of the alignment marks ALM1, ALM2, . . . , ALM8 provided around device 21 are (Xn, Yn) (in FIG. 2, n=1, 2, . . . , 8), and a linear model is assumed for deviation from the design ($\Delta$Xn, $\Delta$Yn) (Equation 1).

$$\Delta X n = a \cdot X n + b \cdot Y n + e \quad \text{Equation 1}$$
$$\Delta Y n = c \cdot X n + d \cdot Y n + f$$

When the deviation from the actual design values of the arrangement coordinates (measured values) of each of alignment marks ALM1, ALM2 . . . is designated as ($\Delta$xn, $\Delta$yn), the residual sum of squares E when this model is applied is given by Equation 2.

$$E = \Sigma \{ (\Delta x n - \Delta X n)^2 + (\Delta y n - \Delta Y n)^2 \} \quad \text{Equation 2}$$

Accordingly, the parameters a, b, c, d, e, and f are calculated to minimize the value E. These parameters include the amount of scaling Rx, Ry in the X and Y directions on the substrate, the amount of offset Ox, Oy of substrate P in directions X, Y, the residual rotational error $\theta$ in the arrangement coordinate system of the shot region, and the amount of incline (degree of orthogonality) $\omega$ and are related as follows:

Rx=a, Ry=d,
Ox=e, Oy=f,
$\theta$=c/d, and
$\omega$=−(b/a+c/d)

Based on the scaling values Rx, Ry in directions X and Y of the substrate, offset values Ox, Oy in directions X and Y of the substrate, the residual rotational error $\theta$ of the shot region in the arrangement coordinate system, and the amount of incline (degree of orthogonality) obtained in this manner, corrections such as individual shot coordinates, rotation, and projection magnification are made so as to satisfy the condition of consecutive connection of patterns A, B, C, and D, of which the device 21 is composed, through their adjacent portions. The same calculations are performed for the shots comprising the other device patterns 22–26 based on the arrangement coordinates of the eight alignment marks provided around the device. Correcting the shot position according to the parameters reduces overlay error at shot connecting portions, permitting exposure of the patterns of subsequent layers. Specifically, the main controller 5 adjusts the magnification of projection optical system PL by a magnification controller, which is not shown in FIG. 1, and corrects the amount of movement of the XY stage 2 (corrects scaling of XY stage 2) through a stage controller 6 based on the correction parameters that are calculated.

Figure 9:
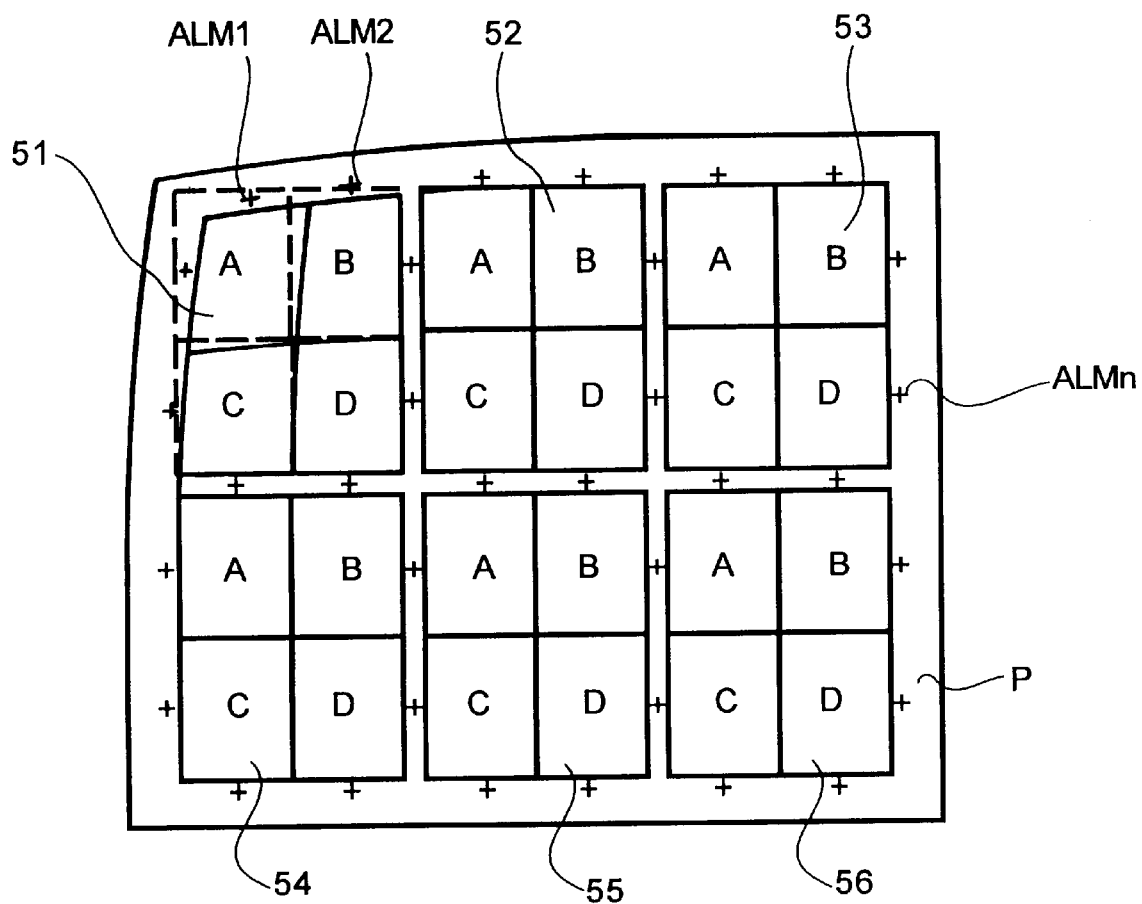
FIG. 9, as noted above, shows a deformed substrate.
Figure 10:
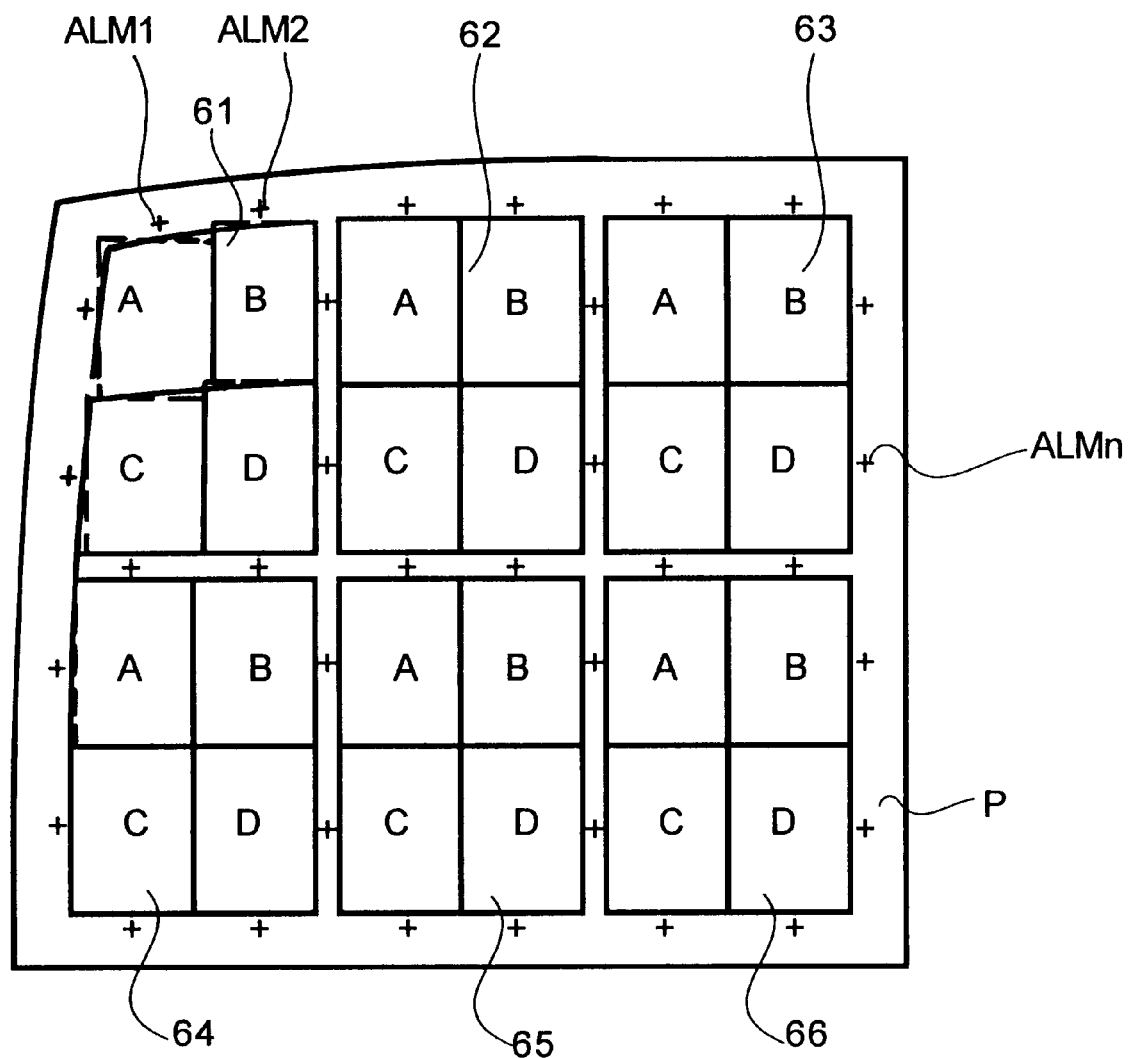
FIG. 10, as noted above, is a model diagram of a pattern exposed by a prior art method.

The processing described above is carried out on the overlay exposed patterns indicated by the dotted lines in FIG. 2. The overlay precision of device pattern 51 in the left upper portion of FIG. 9 is poor, but is improved in FIG. 2. Device pattern 61 in the upper left of FIG. 10 has good overlay precision for each shot but, conversely, a drawback in the form of poor picture connection precision. In FIG. 2, the problem of connection precision has been solved.

In the above-described examples, although the correction parameters were calculated based on the arrangement coordinates of just the alignment marks provided around each device, it is also possible to calculate the correction parameters based on the arrangement coordinates of more numerous alignment marks. For example, the arrangement coordinates of m alignment marks can be employed. To calculate correction parameters, a weighted coefficient Win can be assigned based on the distance Lin between each of alignment marks ALMn (n=1, 2, ... m) from the center position of an $i^{th}$ device pattern, and the residual sum of squares Ei can be evaluated by Equation 3 in the same manner as in Equation 2 to determine parameters a–f in a manner minimizing Ei.

$$Ei=\Sigma Win\{(\Delta xn-\Delta Xn)2+(\Delta yn-\Delta Yn)2\} \quad \text{Equation 3}$$

The weighted coefficient Win can be represented as in Equation 4, for example. Here, S is a parameter for varying the degree of weighting.

$$Win=exp(-Lin2/2S)/(2\pi S)^{1/2} \quad \text{Equation 4}$$

Exposure of a liquid-crystal display-use pattern has been described above. However, the present invention is also applicable to other display patterns and devices formed of multiple shots, such as picture pick-up elements, flat sensors, linear sensors, and thermal heads. Furthermore, it is also applicable when forming devices of multiple shots in semiconductor integrated circuits, as well as to multichip modules and the like.

In the above-described example, the individual parameters were calculated based on information about the positions of alignment marks. It is also possible to read the amount of overlay error using a vernier pattern reading the amount of overlay misalignment after actual overlay exposure.

Furthermore, the amount of direct overlay error can be read, for example, by picture processing from the pattern of the actual device layer being combined and the completed exposure pattern and each parameter can be calculated.

Calculating each parameter from the results of direct exposure increases the reliability of each parameter. That is, as a test exposure, individual parameters calculated by actual exposure can be inputted into the exposure device as offsets during alignment, after which the actual plate is exposed to produce high-precision devices.

Embodiment 1 of the invention is described above. In this embodiment, overlay exposure is possible without the loss of picture synthesis precision even in devices formed by multiple shot picture synthesis, permitting the production of high-precision devices.

Figure 3:
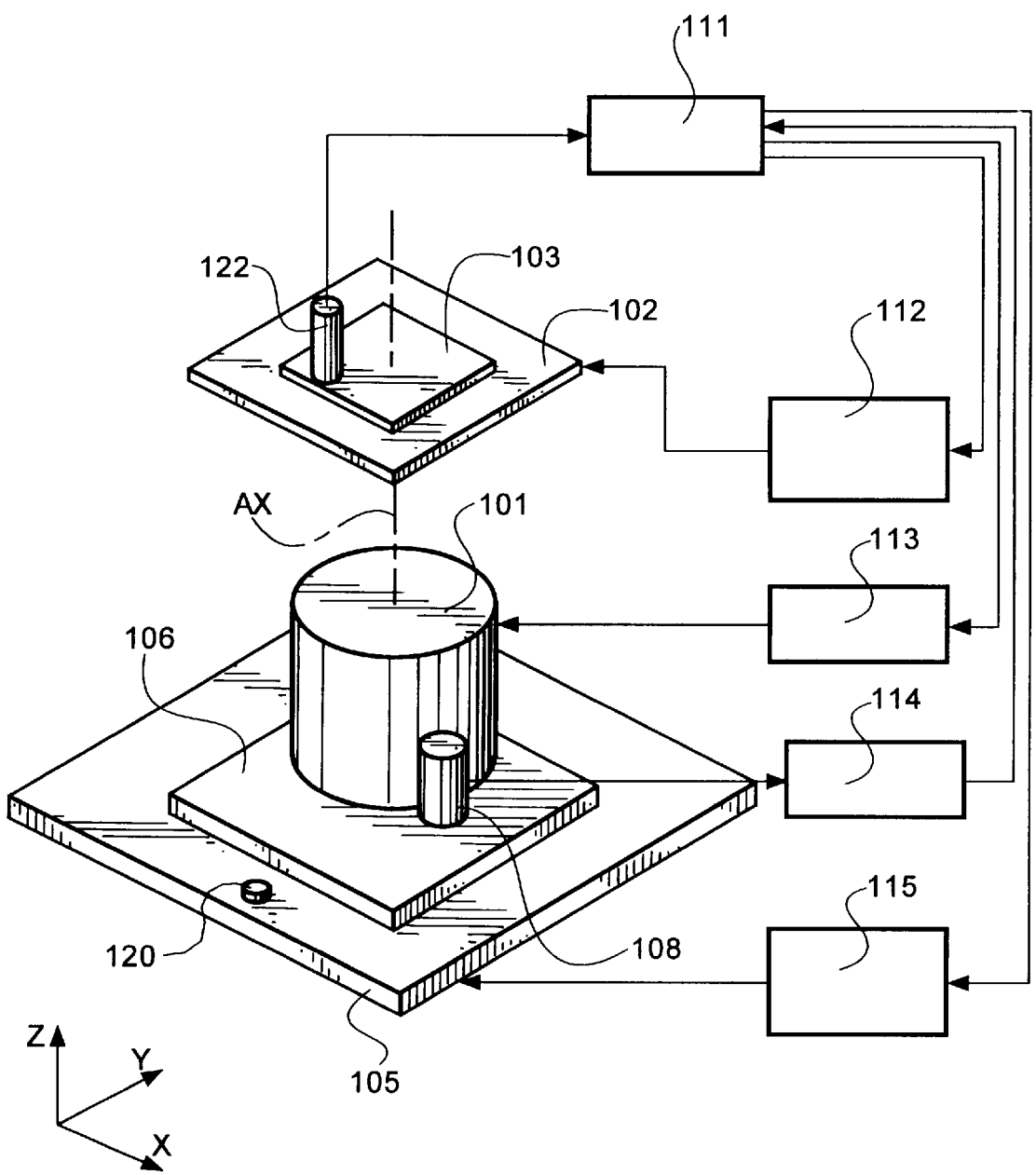
FIG. 3 is a schematic illustration of an exposure device showing a second embodiment of the present invention.

FIG. 3 is a schematic diagram showing an example of the exposure device of the present invention shown in Embodiment 2 of the invention. The exposure device is provided with a projection optical system 101, a mask stage 102 positioned above the projection optical system 101, and a substrate stage 105 positioned below the projection optical system. A mask 103, on the reverse face of which a transfer pattern is formed, is maintained on the mask stage 102, and a substrate 106, such as a glass plate on the reverse face of which photoresist is coated, is maintained on the substrate stage 105. The surface of substrate 106 is also a conjugate of the pattern face of the mask 103 in relation to the projection optical system 101. The mask pattern, illuminated by exposure light from an illumination system (not shown), forms an image on the surface of the substrate 106 through the projection optical system 101.

The substrate stage 105 has a Z axis in the direction of optical axis AX of projection optical system 101 and is capable of moving along a movement coordinate system determined by the X and Y axes, which are perpendicular to the Z axis. The position of the substrate stage 105 within the movement coordinate system is continuously measured by a laser interferometer (not shown). A substrate stage controller 115 controls driving of the substrate stage 105 based on the values measured by the laser interferometer. The mask stage 102 is capable of movement within a two-dimensional plane perpendicular to the Z axis as well as rotation within that plane. The mask stage 102 is driven in two dimensions and rotated (in direction θ) by controls from a mask stage controller 112.

In the projection optical system 101, the magnification can be adjusted by a magnification adjustment device controlled by a magnification controller 113. Such a device is described in U.S. Pat. No. 4,666,273, in which the pressure of a gas sealed between the lens elements of projection optical system 101 is varied to change the refractive index in that space, thereby changing the projection magnification. It is also possible to employ a device in which the projection magnification is varied by moving a special lens element, having the projection optical system 101, in the direction of optical axis AX or the like as the magnification adjusting device.

Figure 4:
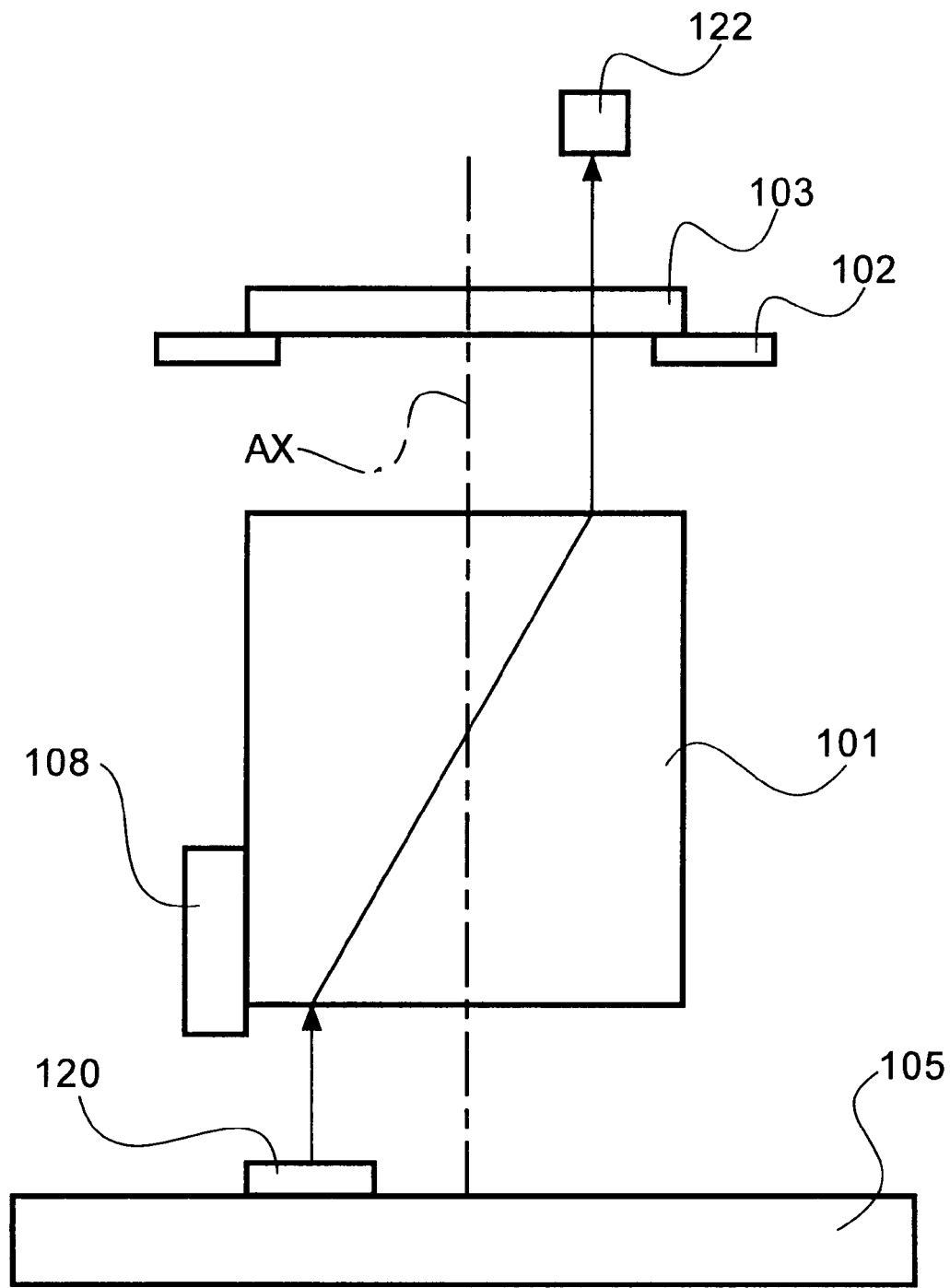
FIG. 4 shows a method of measuring mask alignment marks.

A reference mark 120, calibrating the mask alignment system for measurement of mask alignment marks formed on the mask 103, is provided on substrate stage 105 at the same height as that of the surface of substrate 106. A light source is built into the reference mark 120. During the loading of the mask 103 onto the mask stage 102, the movement of the substrate stage 105 is controlled by the substrate stage controller 115, as shown in FIG. 4, such that a light beam from the reference mark 120 scans mask alignment marks, formed on the mask 103, through the projection optical system 101. During this time, based on the output of the transmitted light quantity received by the alignment sensor 122 and the output of the laser interferometer measuring the position of the substrate stage 105, the position of the mask alignment marks within the movement coordinate system of the substrate stage 105 can be determined. On that basis, the mask stage controller 112 aligns the mask 103 by driving the mask stage 102 in directions X, Y, and θ.

An off-axis alignment microscope 108 comprising a substrate alignment system through a prescribed relation with optical axis AX of projection optical system 101 is positioned near the projection optical system 101. The alignment microscope 108 measures alignment marks formed on the substrate 106 loaded on the substrate stage 105. The alignment controller 114 uses the output of the alignment microscope 108 to calculate the amount of movement of the substrate stage 105 necessary to match the exposure field of the projection optical system 101 with the region of the substrate 106 to be exposed. As will be described further below, the multiple alignment marks formed on substrate 106 are measured to calculate the amount of extension and the like of substrate 106 and, based on the amount of extension, to calculate the magnification correction value of projection optical system 101 and the scale correction value in the movement coordinate system.

Both marks for calibrating the mask alignment system and marks for calibrating the substrate alignment system are provided on the substrate mark 120. Thus, measurement by the alignment microscope 108 of the marks provided on the substrate mark 120 for use by the substrate alignment system reveals the relation between the mask and the alignment microscope 108 by the difference in the design position of the marks on the substrate mark 120 for use by the mask alignment system and those for use by the substrate alignment system. Accordingly, the relation in the positions of the mask 103 and the substrate 106 is determined.

The outputs of the laser interferometer and alignment controller 114 are inputted to a main control element 111 including a microcomputer or a minicomputer. The mask stage controller 112, the magnification controller 113, and the substrate stage controller 115 control the various elements of the exposure device based on control signals from the main control element 111. The exposure procedure employed by the exposure device will be described in connection with the second embodiment.

Figure 5A:
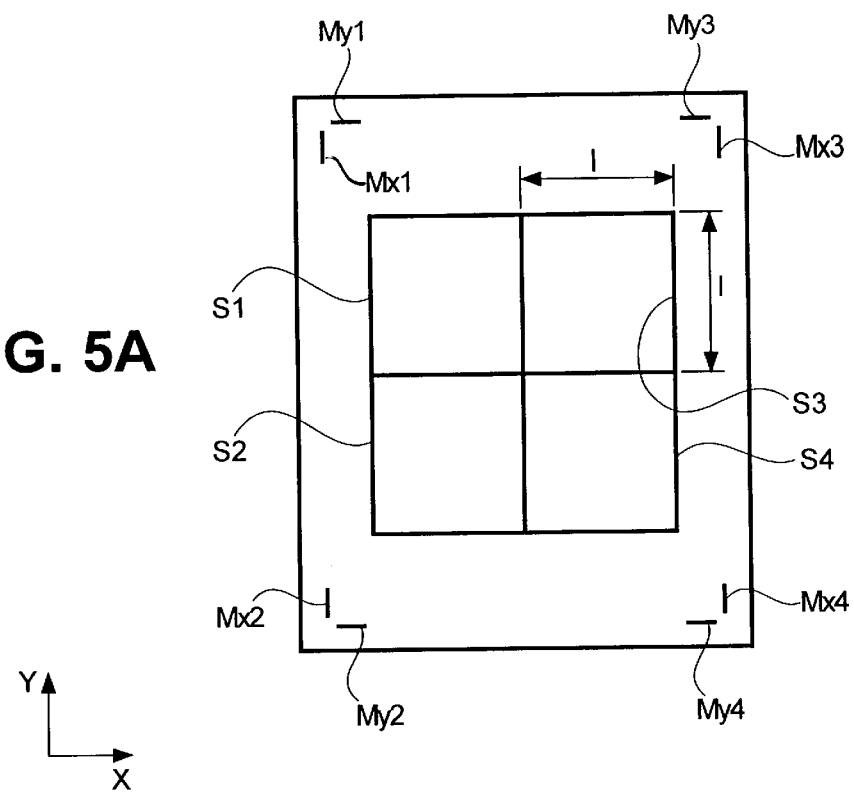
FIGS. 5(a) and 5(b) illustrate an enlargement of the shot region due to substrate swelling.

The first layer of exposure will be described first. As set forth above, after the mask 103 has been aligned, when the substrate 106 is loaded on the substrate stage 105, the substrate stage controller 112 and the like are controlled by the main control element 111, stepping and exposure of the substrate stage 105 are repeated by a step-and-repeat operation, and the first layer mask pattern is transferred. Thus, as shown for example in FIG. 5(a), multiple (here, four) shot regions, S1, S2, S3, and S4, are formed in prescribed regions on the substrate 106. In this embodiment, connected patterns are present in adjacent shot regions. In this first layer exposure, alignment marks MX1, MX2, MX3, and MX4, for positioning in the X-axis direction, and alignment marks MY1, MY2, MY3, and MY4, for positioning in the Y-axis direction, for example, are formed on the substrate 106.

Figure 5B:
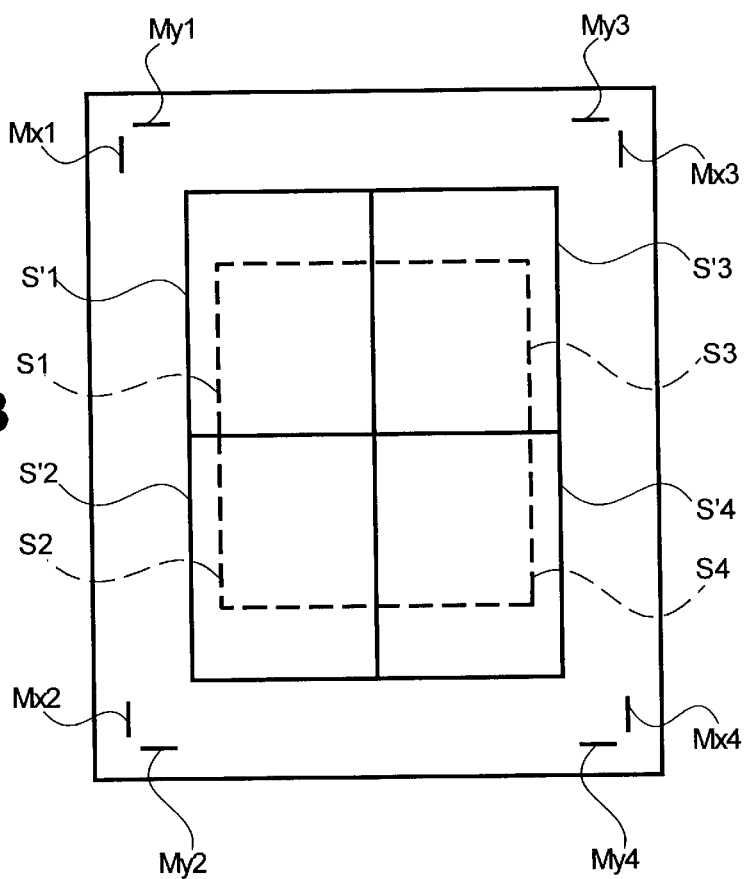

After exposure of the first layer, processing such as developing, etching, and the like is carried out. This processing causes the substrate 106 as shown in FIG. 5(b) to expand such that shot regions S1, S2, S3, and S4, indicated by dotted lines, become regions S1', S2', S3', and S4', indicated by solid lines.

Exposure of the second layer will now be described.

First, the substrate stage 105, on which the substrate 106 is maintained, is driven in the directions of the X and Y axes under the control of the substrate stage controller 115 while monitoring the outputs of the alignment microscope 108 and the laser interferometer. In this way, the positions of alignment marks MX1, MX2, MX3, and MX4, for positioning in the X-axis direction, and alignment marks MY1, MY2, MY3, and MY4, for positioning in the Y-axis direction, formed on substrate 106 are measured.

Next, the individual correction parameters are calculated based on the values measured for the alignment marks. The calculation method employed is the least-squares method. That is, assuming that errors in the positions of the alignment marks have resulted from extension of the substrate 106, alignment errors, and the like, various correction parameters are calculated by reconciling in Equation 5 the design arrangement coordinates (Xj, Yj) of alignment marks MXj, MYj (j=1, 2, 3, 4) with the actual arrangement coordinates the positions of which are to be adapted, that is, alignment mark positions (Xj', Yj') (j=1, 2, 3, 4) that have been corrected by the correction parameters.

$$Xj'=(1+\gamma X \cdot 10-6)Xj-(\theta+\omega)\cdot 10-6Yj+\epsilon X \quad \text{Equation 5}$$

$$Yj'=\theta \cdot 10-6Xj+(1+\gamma Y \cdot 10-6)Yj+\epsilon Y$$

Here, the individual correction parameters are as follows.

(1) Substrate extension: $\gamma X$ (X-axis direction), $\gamma Y$ (Y-axis direction) [ppm]

(2) Substrate rotation: $\theta$ [$\mu$rad]

(3) orthogonality: $\omega$ [$\mu$rad]

(4) Substrate shift: $\epsilon X$ (X-axis direction), $\epsilon Y$ (Y-axis direction) [$\mu$M]

The individual correction parameters are determined, as represented by Equation 6, by minimizing the sum of the squares S of the differences of the actual arrangement coordinates converted based on Equation 5 and the measured values.

$$S = \sum_{j=1}^{N} (X_j'' - X_j')^2 + \sum_{j=1}^{M} (Y_j'' - Y_j')^2 \quad \text{[Equation 6]}$$

In Equation 6,

Xj" is the position measured for the alignment mark in the X-axis direction,

Yj" is the position measured for the alignment mark in the Y-axis direction,

Xj' is the position measured for the alignment mark in the X-axis direction converted by Equation 5, and Yj' is the position measured for the alignment mark in the Y-axis direction converted by Equation 5.

Magnification correction value m [ppm] and the scaling correction value are determined next. In the present invention, magnification correction is conducted using the value between $\gamma X$ and $\gamma Y$, and scaling along the X-axis and Y-axis of the substrate stage movement coordinate system is corrected by a value equal to the magnification correction value. For example, when the average of $\gamma X$ and $\gamma Y$ is employed as the magnification correction value m [ppm], the X-axis scale correction value $\Gamma X$ and Y-axis scale correction value $\Gamma Y$ in the substrate stage movement coordinate system are set as indicated in Equation 7 below.

$$m=(\gamma X+\gamma y)/2 \quad \text{Equation 7}$$

$$\Gamma X=\Gamma Y=m$$

Prior to exposure of the second layer, the magnification controller 113 of the exposure device adjusts the magnification of the projection optical system 101 according to the magnification correction value m calculated in Equation 7. The mask controller 112 rotates the mask 103 by precisely $\theta$ to cancel out substrate rotation $\theta$. The substrate stage controller 115 increases the scale of the X-axis and Y-axis of the movement coordinate system by $(1+m \cdot 10^{-6})$ and moves the substrate 106 along the X-axis and Y-axis with substrate shifts $\epsilon X$ and $\epsilon Y$ as offsets.

Figure 6:
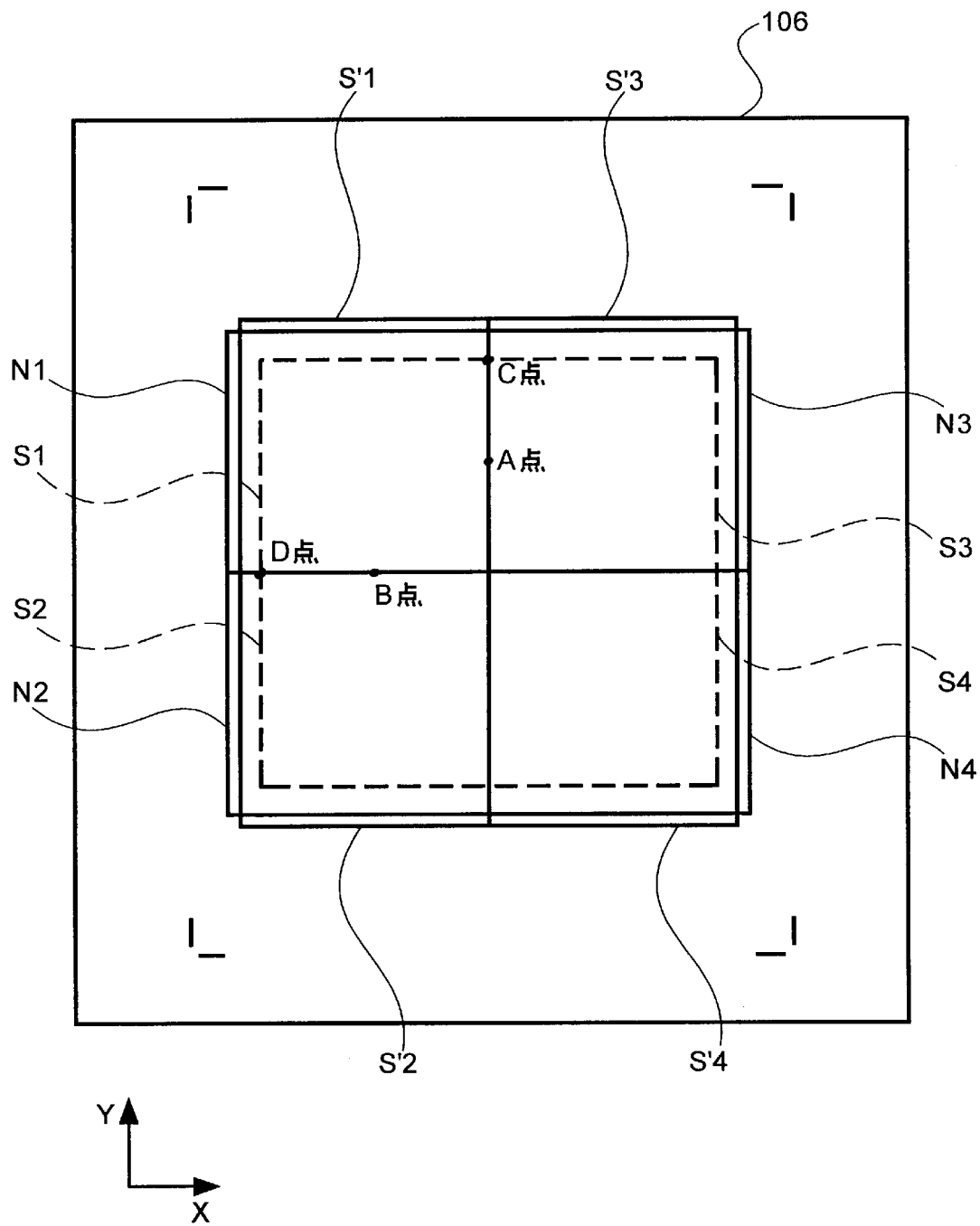
FIG. 6 shows overlay exposure based on the present invention.

FIG. 6 shows the condition in which second layer patterns N1, N2, N3, and N4 have been exposed over shot regions S1', S2', S3', and S4'. The shot regions have been enlarged by post-exposure processing. This is the same as having enlarged the post-exposure picture $(1+m \cdot 10^{-6})$ times in accordance with the design positions in the stage coordinate system.

Figure 11:
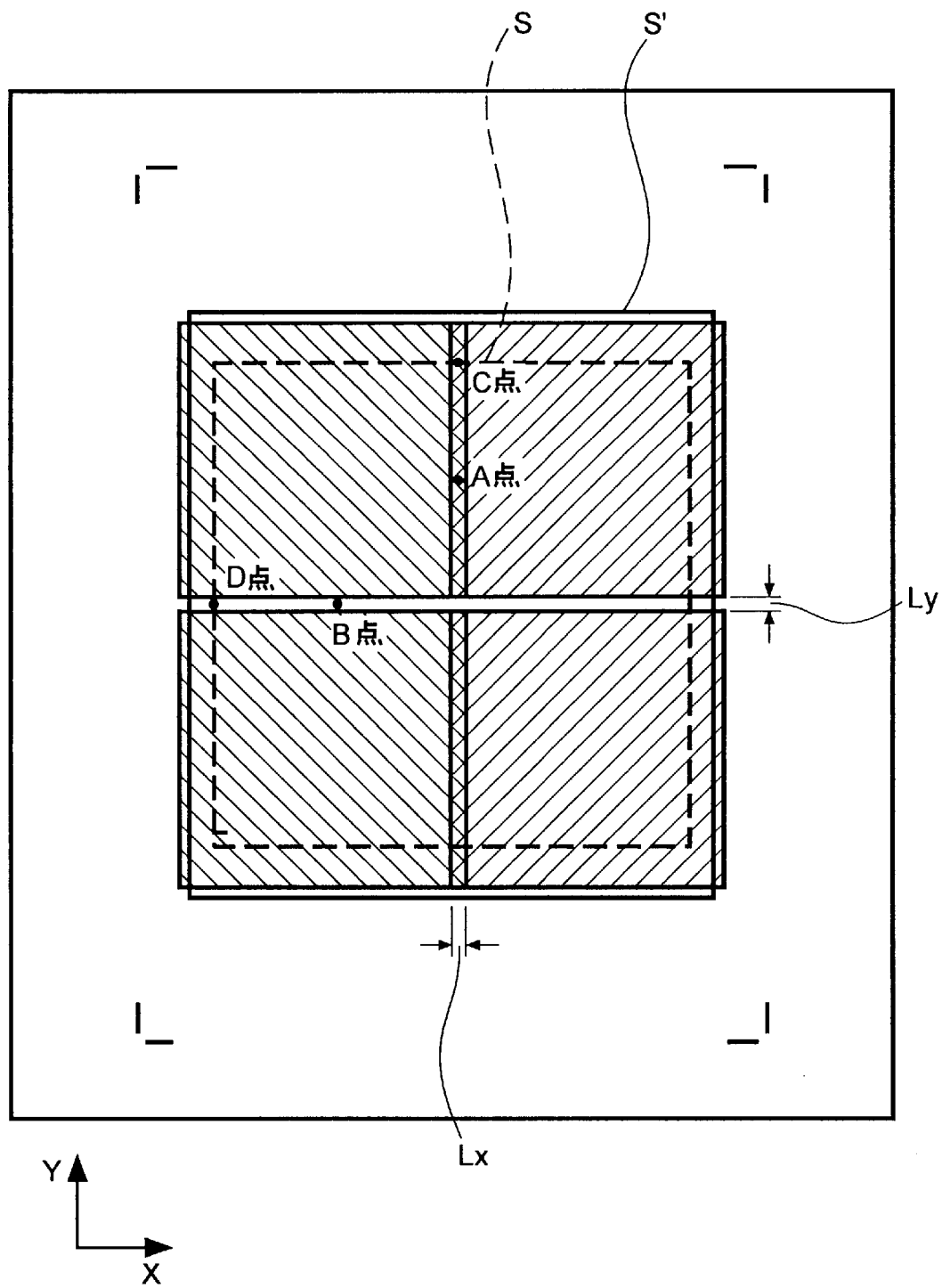
FIG. 11, as noted above, is a diagram showing an overlay exposure produced by a prior art method.

Table 1 below compares the overlay precision and differential overlay precision of the four points A, B, C, and D shown in FIG. 6 based on the present invention and FIG. 11 based on the prior art method. At points A and C, there is overlay from the shot to the left. The differential overlay is the amount of the right-side shot overlay slippage as measured against the standard of the left-side shot overlay slippage for each point. That is, the differential overlay is evaluated as the difference of the respective overlay slippages. For example, where the overlay on point A of the left shot is 0.1 $\mu$m and the overlay on point A of the right shot is 0.2 $\mu$m, the differential overlay is 0.1 $\mu$m. The overlay at points B and D is that of the shot above each of these points, and the differential overlay is the amount of overlay slippage of the shot above as measured against the standard of the overlay slippage of the shot below each of these points. Table 1 shows that the differential overlay can be reduced to zero by the present invention.

TABLE 1

Point A

| | Overlay | | Differential Overlay | |
|---|---|---|---|---|
| | X direction | Y direction | X direction | Y direction |
| Prior art method | | 0 | | 0 |
| Method of present invention | 0 | 0 | 0 | |

The overlay is that of the shot to the left
The differential overlay is the difference between the overlay of the shot to the left and the overlay of the shot to the right.

Point B

| | Overlay | | Differential Overlay | |
|---|---|---|---|---|
| | X direction | Y direction | X direction | Y direction |
| Prior art method | 0 | | 0 | |
| Method of present invention | | 0 | 0 | 0 |

The overlay is that of the shot above.
The differential overlay is the difference between tie overlay of the shot below and the overlay of the shot above.

Point C

| | Overlay | | Differential Overlay | |
|---|---|---|---|---|
| | X direction | Y direction | X direction | Y direction |
| Prior art method | | | | 0 |
| Method of present invention | 0 | | 0 | 0 |

Point D

| | Overlay | | Differential Overlay | |
|---|---|---|---|---|
| | X direction | Y direction | X direction | Y direction |
| Prior art method | | | | 0 |
| Method of present invention | | 0 | 0 | 0 |

Table 2 compares the numerical values of the overlay precision and differential overlay precision of above-described points A, B, C, and D when 1=80 mm, $\gamma X$=5 ppm, and $\gamma Y$=10 ppm. The units are $\mu$m. The numerical values in Table 2 indicate that, for example, in contrast to a differential overlay precision at point A of 0.2 $\mu$m in the X-axis direction and 0 in the Y-axis direction for the prior art method, it was 0 in both the X-axis and Y-axis directions for the present invention.

TABLE 2

| | Prior Art | | Present Invention | |
|---|---|---|---|---|
| Point Evaluated | Overlay | Differential overlay | Overlay | Differential overlay |
| Point A | (0.1, 0) | (0.2, 0) | (0, −0.1) | (0, 0) |
| Point B | (0, 0.1) | (0, 0.2) | (−0.1, 0) | (0, 0) |
| Point C | (0.1, −0.1) | (0.2, 0) | (0, −0.2) | (0, 0) |
| Point D | (−0.1, 0.1) | (0, 0.2) | (−0.2, 0) | (0, 0) |

When an increase in overlay precision is desired in a single direction, it suffices to correct the projection magnification and X-axis and Y-axis scales based on the amount of substrate extension in that direction. For example, when an increase in overlay precision is desired in the X-axis direction, it suffices for m=$\Gamma$X=$\Gamma$Y=$\gamma$X. At this time, although overlay precision becomes poor in the Y-axis direction, the differential overlay is unaffected. In such cases, if the direction in which overlay precision is to be emphasized is known beforehand, then it suffices to measure the amount of substrate extension in that direction alone. Since one or two reference position alignment marks and, normally, detection of any incline of the positioned substrate relative to the stage coordinate system are necessary, two other directions are needed to determine an origin. However, determination of the position of the origin by scaling, although perhaps incorrect, provides good overlay differential precision because the entire system shifts even when the position of the origin has slipped.

Furthermore, when correction values (mask shift, mask rotation, and magnification) are calculated in advance to conform ahead of time to the stage coordinate system for each mask, it suffices to feed back the extension for each layer for magnification and step scaling. Thus, application is readily achieved during exposure.

Since the magnification and step scaling corrections of the second layer exposure are calculated from the amount of extension of the first layer in Embodiment 2 set forth above, overlay precision is good and the differential overlay ideally goes to zero. This permits the manufacturing of high-quality liquid crystal displays.

It is claimed:

1. An exposure method comprising the steps of:
    forming a device pattern comprised of multiple shots on a substrate surface;
    exposing subsequent layer shots by overlaying them on said substrate surface; and
    correcting shot positions so that multiple shots forming a single device are treated as a single unit.

2. The exposure method of claim 1, and further comprising the step of minimizing a differential overlay precision at connecting portions of said multiple shots comprising said device pattern while correcting the shot positions.

3. The exposure method of claim 1, and further comprising the step of emphasizing overlay precision at connecting portions of said multiple shots comprising said device pattern while correcting the shot positions.

4. The exposure method of claim 1, and further comprising the step of emphasizing the precision with which said subsequent layer shots are overlaid while correcting the shot positions.

5. The exposure method of claim 1 wherein the step of correcting the shot positions includes shifting a shot position on the substrate surface.

6. The exposure method of claim 5, wherein the step of correcting the shot positions further includes rotating a shot position on the substrate surface.

7. The exposure method of claim 6, wherein the step of correcting the shot positions further includes adjusting magnification of the device pattern.

8. The exposure method of claim 2 wherein the step of correcting the shot positions includes shifting a shot position on the substrate surface.

9. The exposure method of claim 8, wherein the step of correcting the shot positions further includes rotating a shot position on the substrate surface.

10. The exposure method of claim 9, wherein the step of correcting the shot positions further includes adjusting magnification of the device pattern.

11. The exposure method of claim 3 wherein the step of correcting the shot positions includes shifting a shot position on the substrate surface.

12. The exposure method of claim 11, wherein the step of correcting the shot positions further includes rotating a shot position on the substrate surface.

13. The exposure method of claim 12, wherein the step of correcting the shot positions further includes adjusting magnification of the device pattern.

14. The exposure method of claim 4 wherein the step of correcting the shot positions includes shifting a shot position on the substrate surface.

15. The exposure method of claim 14, wherein the step of correcting the shot positions further includes rotating a shot position on the substrate surface.

16. The exposure method of claim 15, wherein the step of correcting the shot positions further includes adjusting magnification of the device pattern.

17. A substrate on which said device pattern has been transferred by the method according to claim 1.

18. An exposure device for sequentially transferring a pattern formed in a mask onto connected multiple regions present consecutively on a substrate through a projection optical system comprising:
 a substrate stage moving in two dimensions and carrying the substrate in a movement coordinate system determined by a first axis and a mutually perpendicular second axis;
 a mark detecting sensor detecting positions of alignment marks formed on said substrate;
 a magnification adjustment device correcting the magnification of said projection optical system; and
 at least one calculating device separately calculating extension amounts of said substrate in the direction of said first axis and in the direction of said second axis based on information relating to the positions of said alignment marks detected by said mark detecting sensor, setting an amount of magnification correction provided by the magnification adjustment device based on the extension amounts calculated, and changing scales of the first and second axes of the movement coordinate system specifying movement of the substrate stage by identical amounts.

19. The exposure device of claim 18, wherein said at least one calculating device includes an alignment controller using an output from said mark detecting sensor to determine an amount of substrate stage movement needed to match an exposure field of the projection optical system with the multiple regions on the substrate.

20. A substrate on which said pattern has been transferred by the method according to claim 19.

21. In an exposure method by which a multiple-unit pattern image is projected by a projection optical system and a photosensitive substrate is displaced in two dimensions to connect said multiple-unit pattern on said photosensitive substrate and expose a prescribed pattern, the steps of:
 forming a first layer multiple-unit pattern on said photosensitive substrate;
 detecting an amount of deformation of said photosensitive substrate on which said first layer is formed;
 correcting a projection magnification of said projection optical system based on the amount of deformation detected; and
 setting amounts of correction relating to displacement in each of said two dimensions on said photosensitive substrate so that they are nearly identical based on an amount by which said projection magnification is corrected.

22. In the exposure method of claim 21, the further step of forming multiple alignment marks on said photosensitive substrate while forming the first layer multiple-unit pattern on said photosensitive substrate, wherein detecting the amount of deformation of said photosensitive substrate on which said first layer is formed includes detection of said multiple alignment marks.

23. An exposure method comprising the steps of:
 forming a device pattern comprised of multiple shots on a substrate surface;
 exposing subsequent layer shots by overlaying said multiple shots on said substrate surface; and
 correcting shot position in accordance with positional information relating to at least two shots of said multiple shots.

24. A method according to claim 23, wherein said exposure method is practiced with a step-and-repeat type exposure apparatus.

25. A method according to claim 23, wherein the step of correcting the shot position is practiced so as to minimize a differential overlay precision at connecting portions of said multiple shots.

26. A method according to claim 23, wherein the step of correcting the shot position includes shifting the shot position on the substrate.

27. A method according to claim 23, wherein the step of correcting the shot position includes rotating the shot position on the substrate.

28. A method according to claim 23, wherein the step of correcting the shot position includes adjusting magnification of the device pattern.

29. A method according to claim 23, wherein said substrate is a glass plate.

30. A substrate on which said device pattern has been transferred by method according to claim 23.

* * * * *